(12) United States Patent
Ali et al.

(10) Patent No.: US 7,112,532 B2
(45) Date of Patent: Sep. 26, 2006

(54) PROCESS FOR FORMING A DUAL DAMASCENE STRUCTURE

(75) Inventors: Abbas Ali, Plano, TX (US); Ming Yang, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 159 days.

(21) Appl. No.: 10/608,286

(22) Filed: Jun. 27, 2003

(65) Prior Publication Data

US 2004/0092113 A1    May 13, 2004

Related U.S. Application Data

(63) Continuation of application No. 09/901,331, filed on Jul. 9, 2001, now Pat. No. 6,605,540.

(51) Int. Cl.
*H01L 21/302* (2006.01)

(52) U.S. Cl. .................. 438/700; 438/706; 438/720

(58) Field of Classification Search ............... 438/691, 438/692, 694, 706, 710, 712, 720, 773, 724, 438/77, 700, 778; 216/72, 80
See application file for complete search history.

(56) References Cited

U.S. PATENT DOCUMENTS

| 6,060,380 | A   | 5/2000  | Subramanian et al. |         |
|-----------|-----|---------|--------------------|---------|
| 6,235,653 | B1  | 5/2001  | Chien et al.       |         |
| 6,329,281 | B1  | 12/2001 | Lytle et al.       |         |
| 6,342,448 | B1* | 1/2002  | Lin et al.         | 438/687 |
| 6,348,725 | B1* | 2/2002  | Cheung et al.      | 257/642 |
| 6,372,606 | B1* | 4/2002  | Oh                 | 438/435 |
| 6,380,096 | B1* | 4/2002  | Hung et al.        | 438/723 |
| 6,391,761 | B1  | 5/2002  | Lui                |         |
| 6,410,437 | B1* | 6/2002  | Flanner et al.     | 438/689 |
| 6,420,280 | B1* | 7/2002  | Plat               | 438/786 |
| 6,423,654 | B1* | 7/2002  | Sim et al.         | 438/791 |
| 6,429,119 | B1* | 8/2002  | Chao et al.        | 438/633 |
| 6,458,689 | B1* | 10/2002 | Yu et al.          | 438/631 |
| 6,475,929 | B1* | 11/2002 | Gabriel et al.     | 438/783 |
| 6,511,922 | B1* | 1/2003  | Krishnaraj et al.  | 438/778 |
| 6,605,540 | B1* | 8/2003  | Ali et al.         | 438/694 |

FOREIGN PATENT DOCUMENTS

| EP | 0 975 010 A1  | 1/2000 |
|----|---------------|--------|
| WO | WO 01/15219 A2 | 3/2001 |

* cited by examiner

*Primary Examiner*—Lan Vinh
(74) *Attorney, Agent, or Firm*—Peter K. McLarty; W. James Brady, III; Frederick J. Telecky, Jr.

(57) ABSTRACT

The invention describes a method for forming a dual damascene structure. An etch stop layer (150) is formed on a dielectric layer (140). A second dielectric layer (160) is formed on the etch stop layer (150) and an ARC layer (170) is formed the second dielectric layer. A first trench (185) and a second trench (195) are then simultaneously formed in the first and second dielectric layers (140) and (160) respectively.

11 Claims, 3 Drawing Sheets

PROCESS FOR FORMING A DUAL DAMASCENE STRUCTURE

This application is a Continuation of Ser. No. 09/901,331 filing date Jul. 9, 2001 now U.S. Pat. No. 6,605,540.

FIELD OF THE INVENTION

The invention is generally related to the field of semiconductor devices and fabrication and more specifically to a method for forming a dual damascene structure.

BACKGROUND OF THE INVENTION

To increase the operating speed, high performance integrated circuits use copper interconnect technology along with low dielectric constant dielectrics. Currently the dual damascene method is the most widely used method for forming copper interconnects. A typical dual damascene process is illustrated in FIGS. 1(*a*)–1(*c*). As shown in FIG. 1(*a*), a first etch stop layer is formed over a dielectric layer 10 and a copper line 20. A first dielectric layer 40, a second etch stop layer 50, and a second dielectric layer 55 are formed over the first etch stop layer. A patterned layer of photoresist is then formed and used to pattern the etching of the first trench 57. Following the etching of the first trench 57, a backside anti-reflective coating (BARC) layer 60 is formed. During the formation of the BARC layer 60, additional BARC material 65 is formed in the trench 57. The additional BARC material 65 is necessary to protect the bottom surface of the trench during the etching of the second trench 58. This is illustrated in FIG. 1(*b*). A portion of the additional BARC 65 is removed during the etching process. Following the etching of the second trench 58, trench liner material is formed 80 and copper 90 is used to fill both trenches as illustrated in FIG. 1(*c*).

There are a number of important issues concerning the use of the additional BARC 65 to mask the trench. Some of the more important of these are non-uniformity in dense and isolated structures, punching through the first etch stop layer 30 during the etching process, defects caused by the BRAC material etc. These is therefore a need for an improved process that overcomes the issues associated with the use of the BARC trench masking material 65.

SUMMARY OF THE INVENTION

The present invention describes a process for forming dual damascene structures. In particular, a first dielectric layer is formed over a silicon substrate containing one or more electronic devices. A first etch stop layer is then formed over this first dielectric layer and a second dielectric layer is then formed over the first etch stop layer. A silicon oxynitride anti-reflective coating layer is then formed over the second dielectric layer and a first trench is etched to a first depth in the second dielectric layer and the first dielectric layer. A second trench is etched in the second dielectric layer while simultaneously etching the first trench in the first dielectric layer.

BRIEF DESCRIPTION OF THE DRAWINGS

In the drawings:

FIGS. 1(*a*)–1(*c*) are cross-sectional diagrams illustrating the prior art.

FIGS. 2(*a*)–2(*d*) are cross-sectional diagrams illustrating an embodiment of the instant invention.

DETAILED DESCRIPTION OF THE INVENTION

The invention will now be described with reference to FIGS. 2(*a*)–2(*d*). It will be apparent to those of ordinary skill in the art that the benefits of the invention can be applied to other structures where a dual damascene process is utilized.

The requirement of higher clock rates has lead to the use of copper to form the metal interconnect lines in integrated circuits. In addition to the use of copper, dielectric layers such as organosilicate glass (OSG) (dielectric constant ≃2.6) and florosilicate glass (FSG) are currently being used to take advantage of the lower dielectric constant of such materials compared to silicon dioxide. In an embodiment of the instant invention, a first etch stop layer 130 is formed over a copper layer 120 and a dielectric layer 100 as shown in FIG. 2(*a*). The dielectric layer 100 is formed over a silicon substrate which contains one or more electronic devices such as transistors, diodes, etc. These electronic devices will typically be part of an integrated circuit. The dielectric layer 100 may be formed over various portions of an integrated circuit. The copper layer 120 represents a portion of the copper interconnect of the integrated circuit. The first etch stop layer 130 may comprise silicon nitride (SiN), silicon carbide (SiC), or any suitable material. Following formation of the first etch stop layer 130, a first dielectric film 140 is formed over the etch stop layer 130. In an embodiment of the instant invention this first dielectric layer 140 comprises florosilicate glass (FSG) In addition to FSG any suitable dielectric material may be used to form the first dielectric layer 140. Following the formation of the first dielectric layer 140, a second etch stop layer 150 may or may not be formed. This second etch stop layer 150 comprises a material selected from the group consisting of silicon nitride (SiN), silicon carbide (SiC), or any combination of layers of these or other suitable materials. Following the formation of the second etch stop layer 150, a second dielectric layer is formed. In an embodiment of the instant invention this second etch stop layer comprises FSG, OSG or any suitable dielectric material. Following the formation of the second dielectric layer 160, a layer of anti-reflective coating (ARC) 170 is formed as shown in FIG. 2(*a*). In an embodiment of the instant invention this ARC layer 170 comprises silicon oxynitride. An important property of the ARC layer 170 is that no light be reflected during the photolithographic process. Such an ARC film can be formed using silicon oxynitride with the following atomic percentages, silicon (30%–55%), oxygen (20%–50%), nitrogen (2%–17%), and hydrogen (7%–35%). Following the formation of the ARC layer 170, a photoresist layer is formed and patterned 180. The ARC layer 170, the second dielectric layer 160 and the second etch stop layer 150 are etched using a multi-step etch process to form a first trench 185 as illustrated in FIG. 2(*a*). In an embodiment of the instant invention the silicon oxynitride layer can be etched using a $CF_4$ based plasma etch process. In particular a 300 A to 2000 A silicon oxynitride film can be etched using $CF_4$ with flow rates of 50 sccm–120 sccm, oxygen with flow rates of 1 sccm–9 sccm, argon with flow rates of 200 sccm–500 sccm, and power of about 1000 W to 2000 W. One advantage of using the silicon oxynitride film is that thinner layers of photoresist (i.e. less than 3000 A) can be used. This leads to improved resolution over the thicker resist films necessary in current processes. For cases where FSG is used to form the second dielectric layer 160, an argon (200 sccm–400 sccm), $CH_2F_2$ (10 sccm–35 sccm), and oxygen (9 sccm–34 sccm) based plasma etch process can be used with power levels of approximately 1000 W.

Figure 1A:
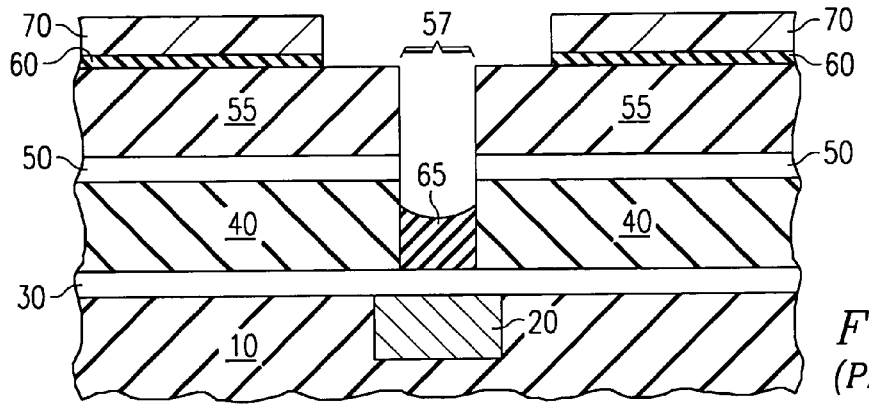
Figure 1B:
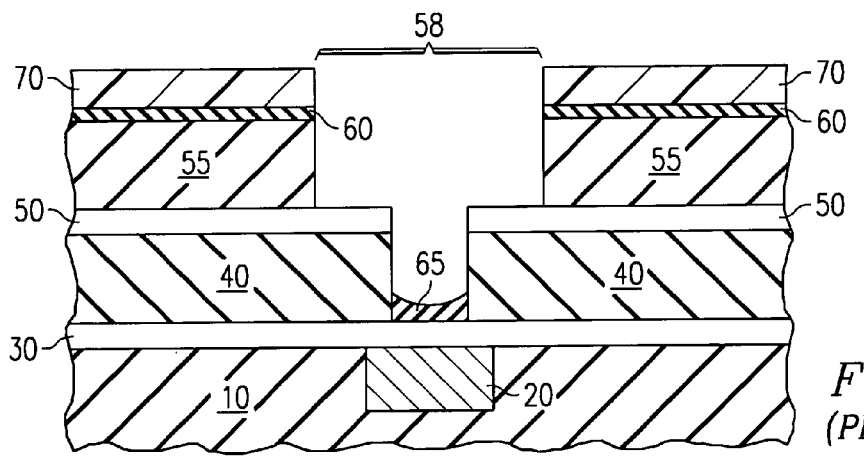
Figure 1C:
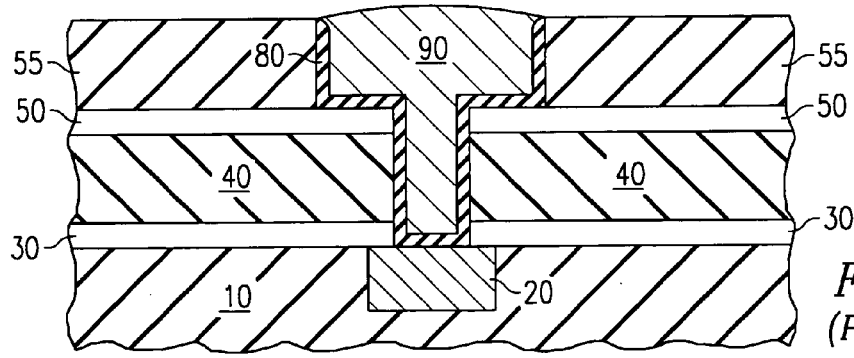
Figure 2A:
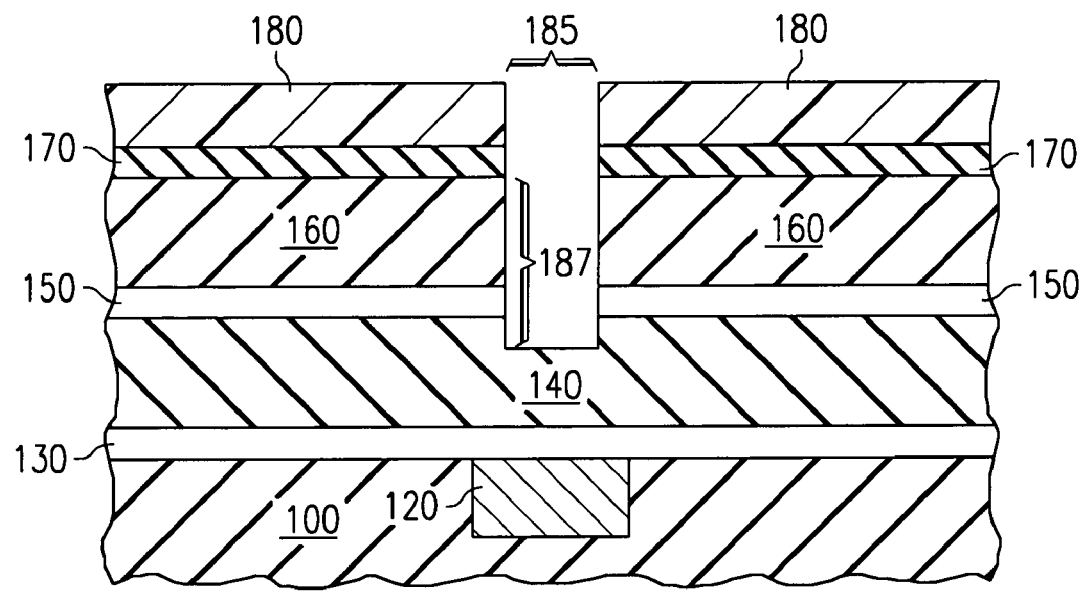

Finally to etch through the second etch stop layer 150, a $C_5F_8$ (5 sccm–13 sccm), argon (300 sccm–650 sccm), and oxygen (4 sccm–13 sccm) etch process with a power level of approximately 1500 W can be used. The depth of the first trench 187 is variable. The embodiment represented in FIG. 2(a) shows the bottom surface of the trench below the second etch stop layer. In general the required depth of the first trench depends on the thickness of the dielectric layers 140 and 160 and the required depth of the second trench.

Figure 2B:
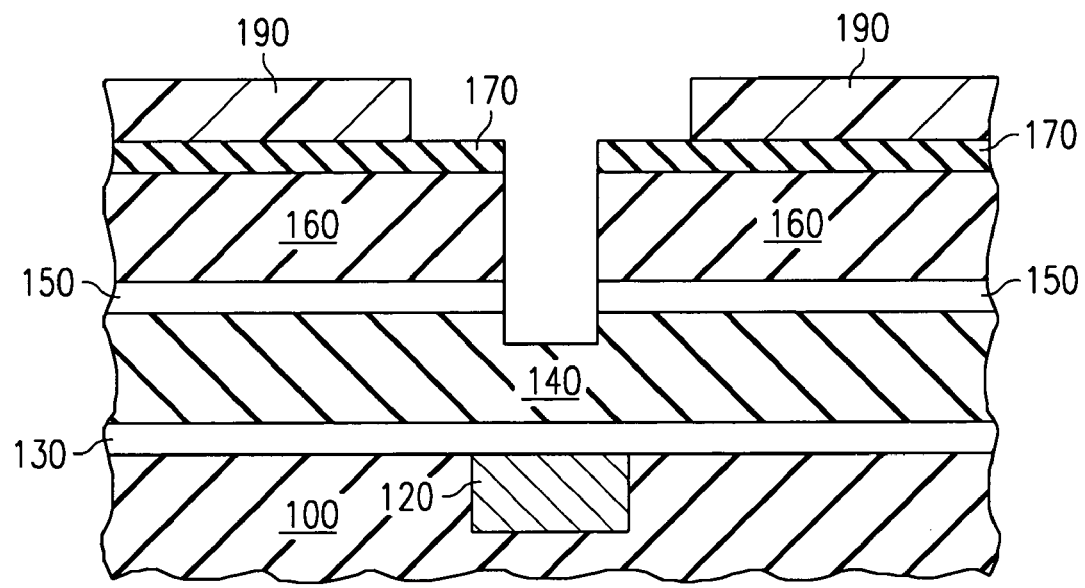
Figure 2C:
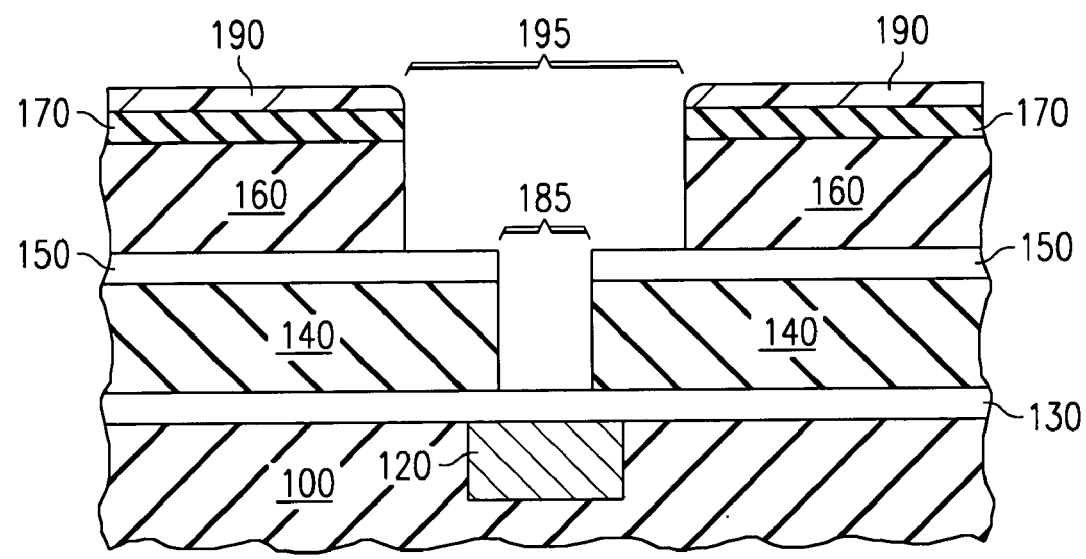

Following the formation of the first trench 185, the remaining photoresist film 180 is removed and another patterned photoresist film is formed 190 which will be used to define the width of the second trench. This is illustrated in FIG. 2(b). Using the photoresist film as an etch mask, the exposed regions of the ARC layer 170 is etched. For the case where a silicon oxynitride ARC layer is used the layer can be etched using a $CF_4$ based plasma etch process. In particular a 300 Å to 2000 Å silicon oxynitride film can be etched using $CF_4$ with flow rates of 50 sccm–120 sccm, oxygen with flow rates of 1 sccm–9 sccm, argon with flow rates of 200 sccm–500 sccm, and power of about 1000 W to 2000 W. During the subsequent etching of the dielectric layers 160 and 140 the ARC layer will serve as a hardmask. Dielectric layers 160 and 140 are then etched simultaneously with a second trench 195 being formed in the second dielectric layer 160 and the first trench 185 etched in the first dielectric layer 140 as shown in FIG. 2(c). The etching of the second trench 195 will stop on the second etch stop layer 150 (if present), and the etching of the first trench 185 in the first dielectric layer 140 will stop on the first etch stop layer 130.

During the formation of the second trench 195 in the second dielectric layer 160, the etching of the first trench 185 is completed in the first dielectric layer. The first etch stop layer 130 beneath the first dielectric layer 140 is therefore not exposed to the entire second trench etching processes. This eliminates the need for the BARC protective layer currently used in the art.

Figure 2D:
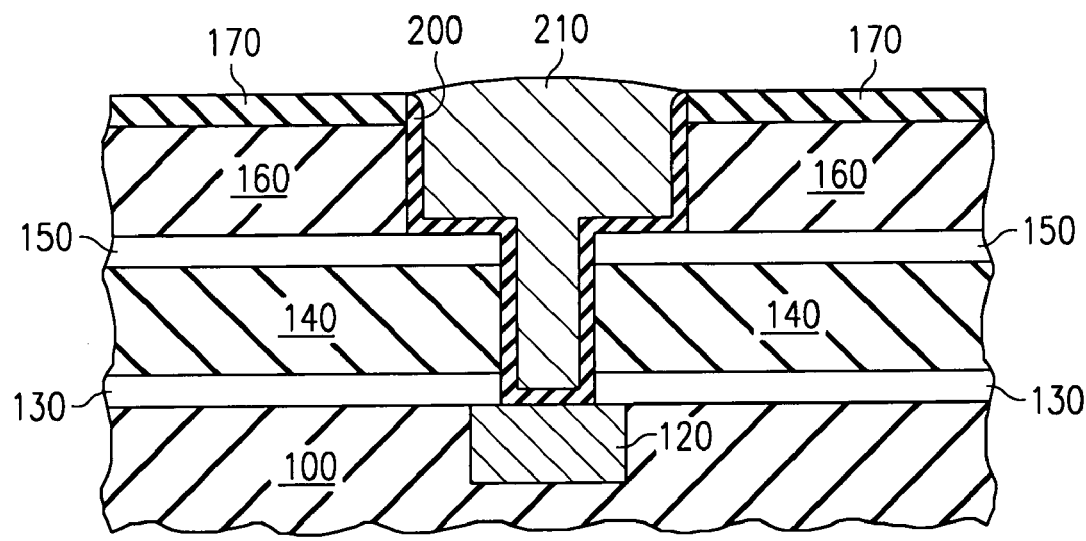

Following the formation of both trenches (185 and 195) the exposed region of the first etch stop layer 130 is removed and a liner film 200 is formed as shown in FIG. 2(d). The formation of the liner film is followed by a copper deposition and chemical mechanical polishing process which results in the copper layer 210 shown in FIG. 2(d). Typically the copper layer 210 is formed by first forming a thick layer of copper followed CMP processes to remove the excess copper.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method for forming a dual damascene structure, comprising:
   providing a silicon substrate containing one or more electronic devices;
   forming a first dielectric layer of a first thickness over said silicon substrate;
   forming a first etch stop layer over said first dielectric layer;
   forming a second dielectric layer of a second thickness over said first dielectric layer;
   forming an anti-reflective coating layer over said second dielectric layer prior to etching of a first trench;
   etching said first trench in said second dielectric layer;
   simultaneously etching a second trench to a first depth in said second dielectric layer and etching said first trench in said first dielectric layer wherein the first depth is approximately equal to the second thickness;
   removing the first etch stop layer at a bottom portion of the first trench;
   forming a liner film in the first trench and the second trench; and
   forming a contiguous copper layer in the first trench and the second trench.

2. The method of claim 1 wherein said anti-reflective coating layer comprises silicon oxynitride.

3. The method of claim 1 wherein first etch stop layer is formed with material selected from the group consisting of silicon carbide and silicon nitride.

4. The method of claim 1 wherein said first dielectric layer is OSG.

5. The method of claim 1 wherein said second dielectric layer is OSG.

6. A method for forming a copper filled dual damascene structure, comprising:
   providing a silicon substrate containing one or more electronic devices;
   forming a first dielectric layer of a first thickness over said silicon substrate;
   forming a first etch stop layer over said first dielectric layer;
   forming a second dielectric layer of a second thickness over said first dielectric layer;
   forming a silicon oxynitride anti-reflective coating layer over said second dielectric layer prior to etching a first trench in said second dielectric layer;
   etching said first trench to a first depth in said second dielectric layer and said first dielectric layer wherein the first depth is greater than the thickness of said second dielectric layer;
   simultaneously etching a second trench to a second depth in said second dielectric layer and etching said first trench in said first dielectric layer wherein the second depth is approximately equal to the second thickness;
   removing the first etch stop layer at a bottom portion of the first trench;
   forming a liner film in the first trench and the second trench; and
   forming a contiguous copper layer in the first trench and the second trench.

7. The method of claim 6 wherein said silicon nitride anti-reflective coating layer comprises 30 to 50 atomic percent of silicon, 20 to 50 atomic percent of oxygen, 2 to 17 atomic percent of nitrogen, and 7 to 35 atomic percent of hydrogen.

8. The method of claim 6 wherein first etch stop layer is formed with material selected from the group consisting of silicon carbide and silicon nitride.

9. The method of claim 6 wherein said first dielectric layer is OSG.

10. The method of claim 6 wherein said second dielectric layer is OSG.

11. A method for forming a dual damascene structure, comprising:
    providing a silicon substrate containing one or more electronic devices;
    forming a first etch stop layer over the silicon substrate;

forming a first dielectric layer over the first etch stop layer;

forming a second etch stop layer over the first dielectric layer;

forming a second dielectric layer over the second etch stop layer;

forming an anti-reflective coating layer over the second dielectric layer prior to etching of a first trench;

etching the first trench having a first width through the anti-reflective coating layer, the second dielectric layer, and the second etch stop layer;

concurrently etching a second trench having a second width greater than the first width through the second dielectric layer down to the second etch stop layer and etching the first trench through the first dielectric layer down to the first etch stop layer, wherein the second trench overlies the first trench;

removing the first etch stop layer at a bottom portion of the first trench;

forming a liner film in the first trench and the second trench; and forming a contiguous copper layer in the first trench and the second trench.

* * * * *